US008504760B2

United States Patent
Lee et al.

(10) Patent No.: US 8,504,760 B2
(45) Date of Patent: Aug. 6, 2013

(54) METHOD AND APPARATUS FOR MANAGING ERASE COUNT OF MEMORY DEVICE

(75) Inventors: Hak-yong Lee, Suwon-si (KR);
Byoung-sul Kim, Suwon-si (KR);
Kwang-won Park, Suwon-si (KR);
Jun-ho Jo, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 314 days.

(21) Appl. No.: 12/948,157

(22) Filed: Nov. 17, 2010

(65) Prior Publication Data

US 2011/0131368 A1 Jun. 2, 2011

(30) Foreign Application Priority Data

Nov. 30, 2009 (KR) .................. 10-2009-0117092

(51) Int. Cl.
*G06F 12/00* (2006.01)
(52) U.S. Cl.
USPC ......................................................... 711/103
(58) Field of Classification Search
USPC .................................................... 365/185.33
See application file for complete search history.

(56) References Cited

U.S. PATENT DOCUMENTS

| 7,171,536 | B2 * | 1/2007 | Chang et al. ............ 711/170 |
| 7,692,970 | B2 * | 4/2010 | Park et al. ............ 365/185.22 |
| 8,103,821 | B2 * | 1/2012 | Chang et al. ............ 711/103 |
| 2009/0287875 | A1 * | 11/2009 | Lin ............ 711/103 |

FOREIGN PATENT DOCUMENTS

| JP | 06-275088 | 9/1994 |
| JP | 08-273390 | 10/1996 |
| KR | 1020080064476 | 7/2008 |

\* cited by examiner

*Primary Examiner* — Hiep Nguyen
(74) *Attorney, Agent, or Firm* — F. Chau & Associates, LLC (57) ABSTRACT

A non-volatile memory device having a hidden cell located separate from data storage cells, and a method of effectively managing an erase count of the non-volatile memory device. The method includes preparing the non-volatile memory device that includes a hidden cell located separate from data storage cells and is not accessible to users of the data storage cells, and increasing an erase count stored in an erase count storing region of the hidden cell corresponding to at least one erased data storage cell when the at least one data storage cell is erased.

19 Claims, 9 Drawing Sheets

METHOD AND APPARATUS FOR MANAGING ERASE COUNT OF MEMORY DEVICE

CROSS-REFERENCE TO RELATED APPLICATION

This application claims priority to and the benefit of Korean Patent Application No. 10-2009-0117092, filed on Nov. 30, 2009, in the Korean Intellectual Property Office, the entire content of which is incorporated by reference herein.

BACKGROUND

The present disclosure relates to memory devices, and more particularly, to a method and apparatus for managing an erase count of a semiconductor memory device.

Flash memory is a type of non-volatile memory which is physically compact and can provide a high degree of integration and thus has recently been used in various mobile applications, such as mobile phones, MP3 players, digital cameras, camcorders, universal serial bus (USB) drives, personal digital assistants (PDAs), navigation systems, and e-books. Furthermore, solid state drives (SSDs) employing such flash memory have replaced in computer systems large-capacity hard discs using a motor, such as in laptop computers or net books, which need to have a compact structure and low power consumption. This trend is expected to continue to increase.

In flash memory, an erase operation is typically performed before a storage block therein is programmed but the number of times that a flash memory block can be erased is limited. For example, from among various NAND flash memory devices, a single-level cell (SLC) that has a 1-bit storage space can have erasures performed about one million times, and a multi-level cell (MLC) that has a 2-bit storage space or more can have erasures performed about one hundred thousands times.

The lifetime of flash memory is determined by the number of times that the flash memory is erased. Thus, if erase and program operations are concentrated on one certain block in flash memory, then the lifetime of the whole flash memory may be shortened even though most of cells are not worn. Accordingly, it becomes important that all memory cells in flash memory be uniformly programmed and erased such that the lifetime of the flash memory can be increased.

In this regard, memory systems can employ various wear leveling mechanisms, each having varying levels of longevity enhancement. Those of ordinary skill in the art will appreciate that wear leveling, wherein a wear leveling algorithm tracks the least used physical location or block to identify where to next write data, is generally performed to change the physical location or block related to a particular logic block address (LBA) so that the same LBA may not be related to the same physical location or block.

Also, it becomes important to continuously monitor the degree to which each block of flash memory is worn so that wear leveling can be effectively performed.

SUMMARY

The inventive concept provides a method and apparatus for effectively managing an erase count of a non-volatile memory device so that wear leveling can be effectively performed.

According to an exemplary embodiment of the inventive concept, a method of managing an erase count of a non-volatile memory device having data storage cells is provided. The non-volatile memory device is configured to include hidden cells located separate from the data storage cells and not accessible to users of the data storage cells. When at least one data storage cell of the non-volatile memory device is erased, an erase count stored in an erase count storing region of a hidden cell corresponding to the at least one erased data storage cell is increased.

During initialization of the non-volatile memory device an erase count read command for reading the erase count of the non-volatile memory device may be received. The erase count from the erase count storing region of the hidden cell may be read. The read erase count may be stored in a temporary memory cell.

The erase count storing region may be divided into a least significant bit region and a most significant bit region, and when the erase count is read from the erase count storing region, the erase count is read from both the least significant bit region and the most significant bit region and is then stored in the temporary memory unit.

Before increasing the erase count stored in the erase count storing region of the hidden cell, the erase count stored in the erase count storing region of the hidden cell may be backed up in a backup region of the hidden cell corresponding to the erase count storing region.

A counter may increase the erase count stored in the erase count storing region of the hidden cell corresponding to the at least one data storage cell, when the at least one data storage cell is sensed.

The erase count storing region of the hidden cell may further store location information of the data storage cell.

The non-volatile memory device may be NAND flash memory, the data storage cell being a block of the NAND flash memory, and the erase count corresponding to a block erasure.

According to an exemplary embodiment of the inventive concept, a method of managing an erase count of a non-volatile memory device including a hidden cell located separate from data storage cells of the non-volatile memory device and not accessible to users of the data storage cells is provided. The non-volatile memory device is powered on. An erase count read command for reading an erase count stored in the hidden cell is received. The erase count is read from the hidden cell and stored in a temporary memory unit.

The receiving of the erase count read command may be performed together with initialization of a flash translation layer.

The erase count stored in the hidden cell corresponding to at least one data storage cell of the non-volatile memory device may be increased when the at least one data storage cell is erased.

Wear leveling may be performed by reading the erase count from the temporary memory unit.

The temporary memory unit may be a random access memory.

According to an exemplary embodiment of the inventive concept, a non-volatile memory device includes a counter for increasing an erase count of at least one data storage cell of the non-volatile memory device when the at least one data storage cell is erased, and a hidden cell for storing an increased erase count. The hidden cell is located separate from the at least one data storage cell and is not accessible to users of the at least one data storage cell.

A backup region may store the erase count before the erase count is increased by the counter.

The non-volatile memory device may further include a temporary memory unit for reading the erase count from the hidden cell during initialization of the non-volatile memory device and storing a read erase count in the temporary memory unit.

According to an exemplary embodiment of the inventive concept, a non-transitory computer readable medium includes a first computer program instruction for inputting an erase count read command for reading an erase count of a non-volatile memory device and storing a read erase count in a hidden cell of the non-volatile memory device during initialization of the non-volatile memory device, and a second computer program instruction for storing in a temporary memory unit an erase count read from the hidden cell. The hidden cell is located separate from data storage cells of the non-volatile memory device and is not accessible to users of the data storage cells.

The non-transitory computer readable medium may further include a third computer program instruction for increasing an erase count corresponding to at least one data storage cell of the non-volatile memory device when the at least one data storage cell is erased.

The non-transitory computer readable medium may further include a fourth computer program instruction for backing up the corresponding erase count in a backup region of the hidden cell before increasing the corresponding erase count when the at least one data storage cell is erased.

According to an exemplary embodiment of the inventive concept, a method for increasing the lifetime of a flash memory having data storage cells is provided. The flash memory is configured to include a hidden cell located separate from the data storage cells and not accessible to users of the data storage cells. An erase count corresponding to at least one erased data storage cell is stored in an erase count storing region of the hidden cell and the erase count is increased when the at least one data storage cell is erased. During a write or erase operation wear leveling is performed using current erase counts such that mapping swapping of the data storage cells is performed according to a wear leveling algorithm Data storage cells having a current erase count greater than a predetermined erase count amount are prevented from being used.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Hereinafter, exemplary embodiments of the inventive concept will be described in detail with reference to the accompanying drawings. Like reference numerals denote like elements throughout the drawings. In the present disclosure, for convenience of explanation, a non-volatile memory device and a flash memory device are considered as the same device.

Figure 1A:
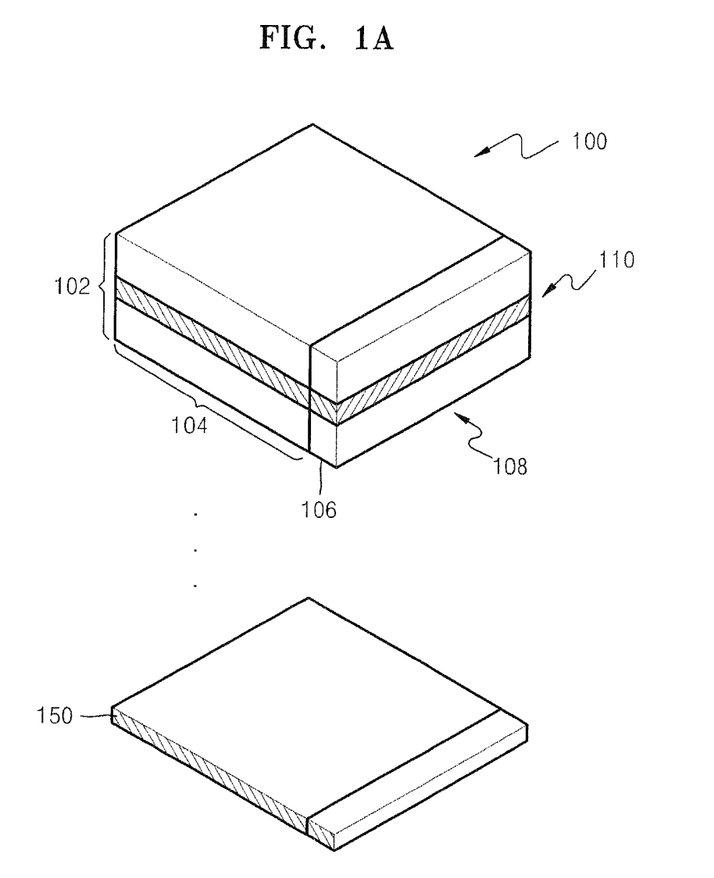
FIGS. 1A and 1B illustrate a memory array for storing an erase count, according to an exemplary embodiment of the inventive concept.
Figure 1B:
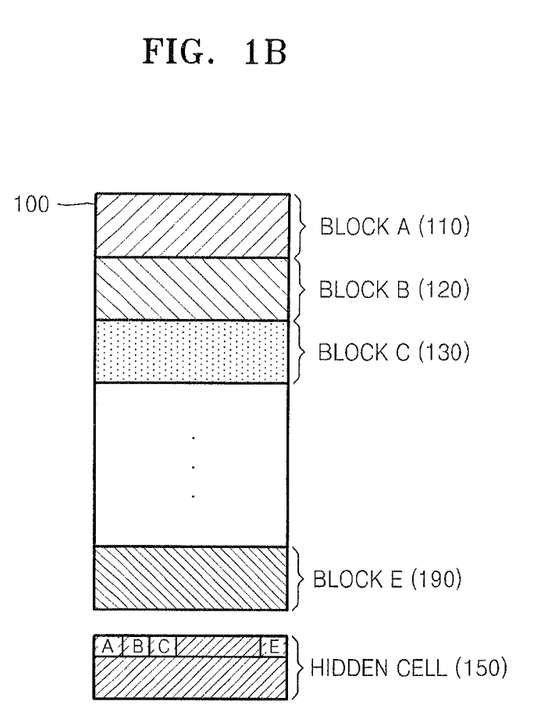

FIGS. 1A and 1B illustrate a memory array 100 of a memory device for storing an erase count, according to an exemplary embodiment of the inventive concept. Referring to FIG. 1A, the memory array may include data storage cells. The data storage cells can provide storage for bits, e.g. an 8-bit depth area 108, for bytes, e.g., a 2 kB area 104 and a 64-byte spare area 106, for pages, e.g., a 512 k page area 102, and for blocks, e.g., a block A 110. The block A is composed of, for example, 64 pages. In the current exemplary embodiment, the memory array 100 includes the block A 110 and additionally includes a hidden cell 150 which may be separately disposed from the data storage cells. If 2 bytes are allocated for one block erase count, 4096 bytes are needed for a total of 2048 blocks, i.e., one page of hidden cell may be sufficient for 2048 blocks erase count.

FIG. 1B is a side view of the memory array of FIG. 1A. Referring to FIG. 1B, the memory array includes the block A 110, a block B 120, a block C 130, . . . through to a block E 190. An erase count of each of the block A 110 to the block E 190 is stored in the hidden cell 150 that is located separate from the memory array 100 that a user may access. In the hidden cell 150, cells A to E are separated as storage regions for storing the erase counts of the respective block A 110 to the block E 190.

Alternatively, if the erase counts are not stored in the hidden cell 150, they may be stored in the corresponding block A 110 to the block E 190, respectively. For example, the erase count of the block A is stored in the block A. However, such a method may not be practical when the non-volatile memory is NAND flash memory, since erasing is performed on a block basis and erase counts are not effectively secured. This is because an erase count of a block would also be erased when the block is erased.

As another alternative, the erase counts of the respective blocks A 110, B 120, C 130 may be stored in the block E 190. However, even in this case, the block E 190 could be erased since the memory array 100 to which general users may access stores the erase counts. Also, in this case, it takes time to additionally read the erase counts from the memory array 100 after system initialization. That is, software overhead may increase.

However, when the erase counts are separately stored in the hidden cell 150, these problems can be prevented, and the memory system can safely secure the erase counts.

Figure 2:
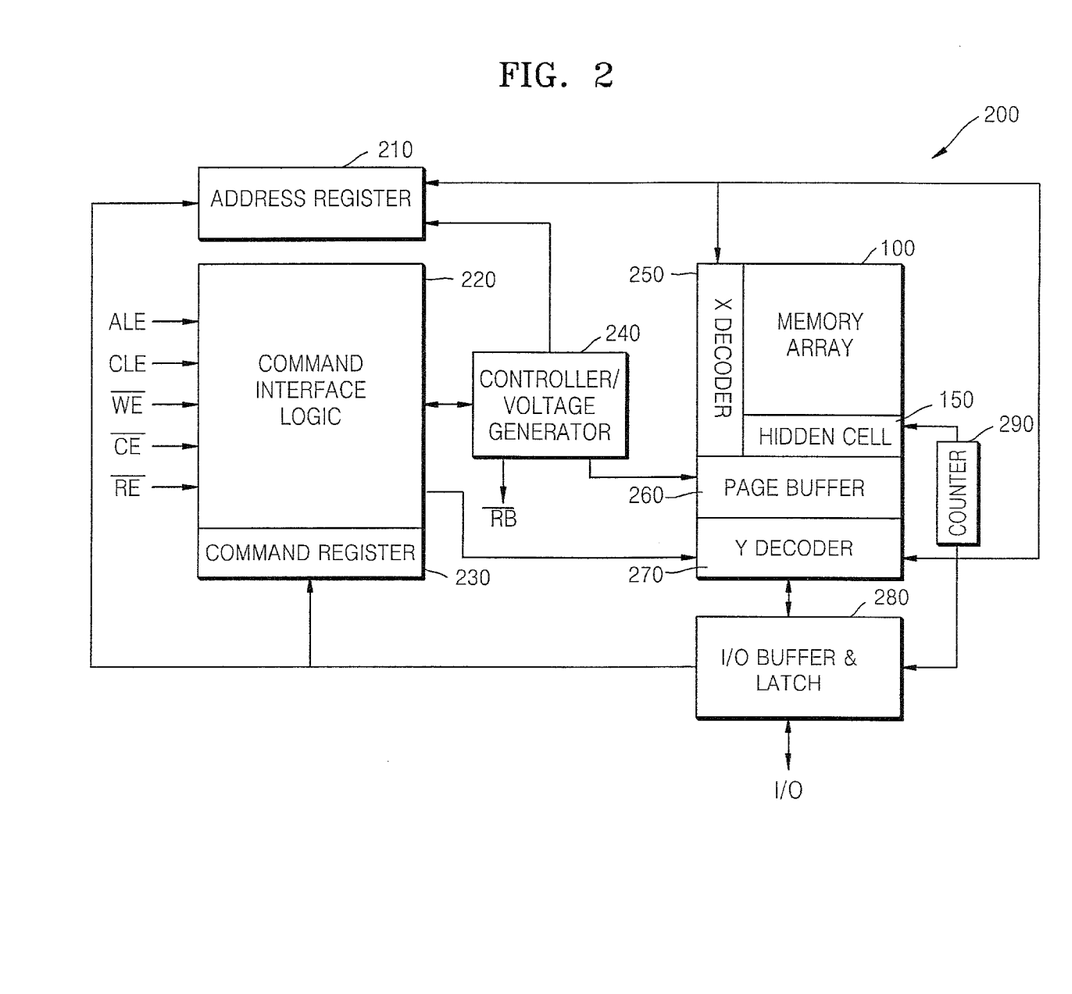
FIG. 2 is a block diagram of a flash memory device in which an erase count is stored, according to an exemplary embodiment of the inventive concept.

FIG. 2 is a block diagram of a flash memory device 200 in which an erase count is stored, according to an exemplary embodiment of the inventive concept. The flash memory device 200 includes a memory array 100, a hidden cell 150, an address register 210, a command interface logic 220, a command register 230, a controller and voltage generator 240, an X decoder 250, a page buffer 260, an Y decoder 270, an input/output (I/O) buffer and latch 280, and a counter 290. The memory array 100 includes a plurality of memory blocks.

In the exemplary embodiment depicted in FIG. 2, a plurality of control signals, namely, an address latch enable (ALE) signal, a command latch enable (CLE) signal, a write enable (/WE) signal, a chip enable (/CE) signal, and a read enable (/RE) signal are provided to the command interface logic 220.

As would be apparent to those of ordinary skill in the art, a general flash memory device includes a /RE pin and a /WE pin, and the command interface logic 220 supplies a clock signal to the /RE pin to read data from the memory array 100, and supplies a clock signal to the /WE pin to write data, such as an address, a command, and program data, to the flash memory device 200.

More specifically, the command interface logic 220 supplies a write command, a read command, or an erase command to the controller and voltage generator 240 according to the control signals ALE, CLE, /WE, /CE, or /RE. The controller and voltage generator 240 generates a voltage, and/or a ready/busy bar signal /RB according to the write command, the read command, or the erase command. The address register 210 generates a row or column signal and supplies this signal to the X decoder 250 and the Y decoder 270 so as to select a cell of the memory array 100. The page buffer 260 interfaces with the memory array 100 to read data from or write data to the memory array 100. The I/O buffer and latch 280 inputs a command and outputs read information. The counter 290 increases an erase count whenever erasing is performed on a block from among the plurality of blocks in the memory array 100, and the increased erase count is stored in a storage region of the hidden cell 150, which corresponds to the block erased.

In the hidden cell 150, a plurality of regions are placed separately to correspond to the plurality of blocks of the memory array 100, respectively. Thus, whenever one of the plurality of blocks of the memory array 100 is erased, only the erase count of the storage region (cell) corresponding to the block is updated. As will be described below in more detail, the updated erase count is loaded in a temporary storage region, such as random access memory (RAM), during initialization of the flash memory device 200 and is used to perform, for example, wear leveling.

The hidden cell 150 is inaccessible to users by locating the hidden cell 150 separate from data regions that users may access and is thus prevented from being erased.

Since data is prevented from mistakenly being deleted from the hidden cell 150, not only erase counts but also various types of non-data information, e.g., meta data information of the flash memory device 200, can be stored safely in the hidden cell 150. Since erase counts stored in the hidden cell 150 are stored in the temporary storage region, such as RAM, during initialization of the flash memory device 200, the meta data information can also be managed conveniently by using the hidden cell 150.

Figure 3:
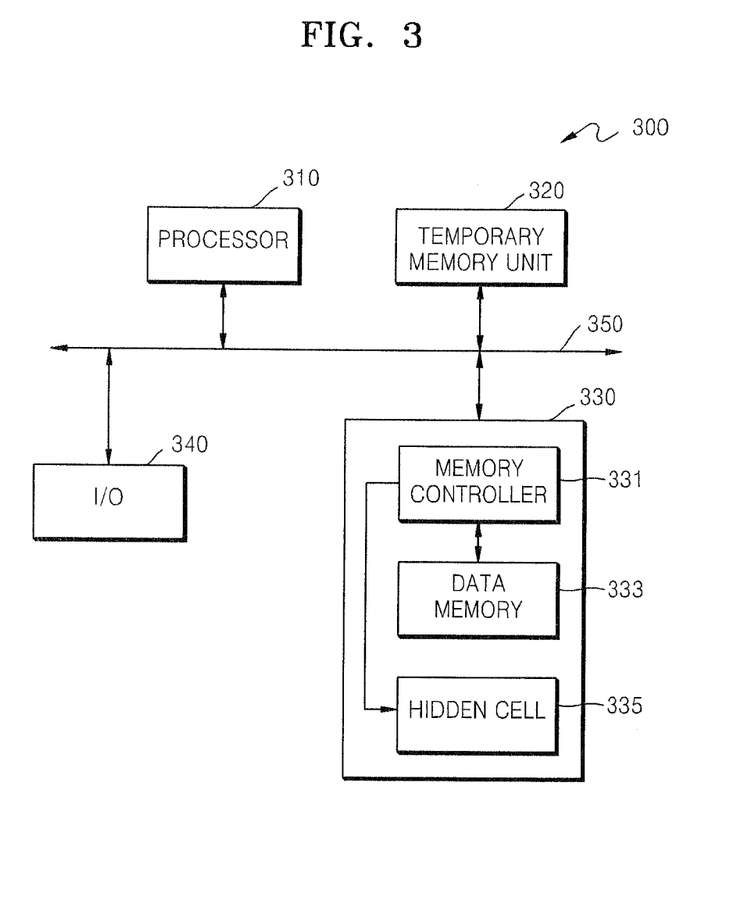
FIG. 3 is a block diagram of a memory system for storing an erase count during an initialization process, according to an exemplary embodiment of the inventive concept.

FIG. 3 is a block diagram of a memory system 300 having a memory unit 330 for storing an erase count during an initialization process, according to an exemplary embodiment of the inventive concept. The memory system 300 includes a processor 310, a temporary memory unit 320 for temporarily storing data, the data memory unit 330, an I/O unit 340 for exchanging data with an external device, and a system bus 350 for establishing data communication.

The data memory unit 330 includes a data memory 333 that stores data, a memory controller 331 that controls a data file to be read from, be written to, or be updated in the data memory 333, and a hidden cell 335 that stores erase counts.

The processor 310 reads the erase counts from the hidden cell 335 of the data memory unit 330 and stores them in the temporary memory unit 320 during initialization of the whole memory system 300. The temporary memory unit 320 may be a temporary storage region, such as DRAM, but is not limited to DRAM and may be embodied as various types of memory.

The data memory unit 330 as illustrated in FIG. 3 may be NAND flash memory, in which a basic element for managing the erase counts may be, but is not limited to, a block. According to the inventive concept, it is possible to manage erase counts of various types of memory for wear leveling. For example, the data memory unit 330 may be phase-change random access memory (PRAM). In order to manage erase counts in PRAM, a basic element may be a word and the erase counts are managed on a word basis.

Since the erase counts of respective blocks of the data memory 333 are stored in the temporary memory unit 320, a system controller (not shown) uses the erase counts for wear leveling. That is, the system controller may perform mapping swapping according to a wear leveling algorithm during a write or erase operation, in which a block having an erase count amount greater than a predetermined erase count amount is prevented from being used such that all blocks can be evenly worn.

Whenever erasing is performed on a block of the data memory 333, the erase count of the block is updated and stored in the hidden cell 335.

Figure 4:
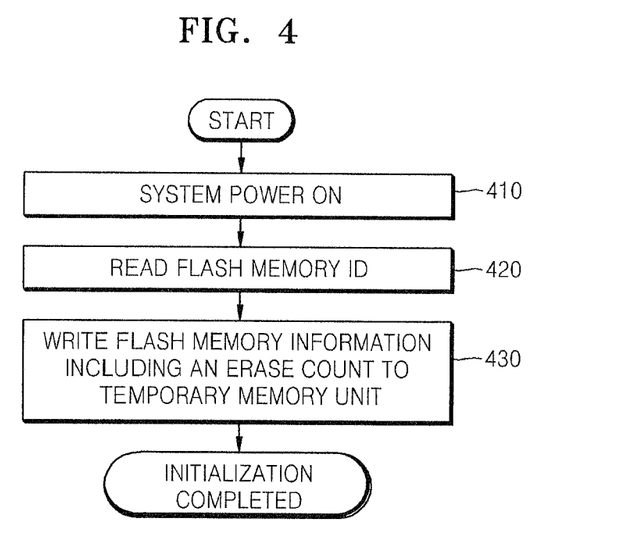
FIG. 4 is a flowchart illustrating a method of initializing the memory system of FIG. 3, according to an exemplary embodiment of the inventive concept.

FIG. 4 is a flowchart illustrating a method of initializing the memory system 300 of FIG. 3, according to an exemplary embodiment of the inventive concept. Referring to FIGS. 3 and 4, in an exemplary embodiment the data memory 333 of the memory system 300 is NAND flash memory. When the memory system 300 is powered on (operation 410), the processor 310 begins initialization of the memory system 300. The processor 310 needs to collect information in order to control the data memory unit 330 while checking that the data memory unit 330 operates normally. To this end, the processor 310 reads an identifier (ID) of the data memory unit 330 from the data memory unit 330 (operation 420).

For example, the processor 310 outputs a control signal /CE that is logic low, and writes a flash memory ID read command 0x90 to the data memory unit 330. Then, data is read from the data memory unit 330. The read data contains the name of the manufacturer of and the ID of the data memory unit 330. If the control signal /CE changes to logic high, reading of the ID of the data memory unit 330 is completed. Similarly, in order to read other information regarding the data memory unit 330, the processor 310 writes a command related thereto to the data memory unit 330 and reads the other information from the data memory unit 330. In this case, the processor 310 accesses the hidden cell 335, reads erase counts of all NAND flash memory blocks and stores the erase counts together with the read information in the temporary memory unit 320 (operation 430). The erase count read command by the processor 310 is read together with initialization of a flash translation layer (FTL).

If the erase counts are respectively stored in the corresponding NAND flash memory blocks rather than the hidden cell 335, a data array (not shown) is additionally accessed to read the erase counts after the initialization of the memory system 300. However, according the current exemplary embodiment, the erase counts may be stored in the temporary memory unit 320 during the initialization of the memory system 300, thereby performing effective software management.

If the erase counts are stored in the data array of the data memory unit 330, pages containing the latest erase count information would be additionally detected and read from software. However, according to the current exemplary embodiment, such a process may be omitted and software overloading is thereby prevented.

Figure 5:
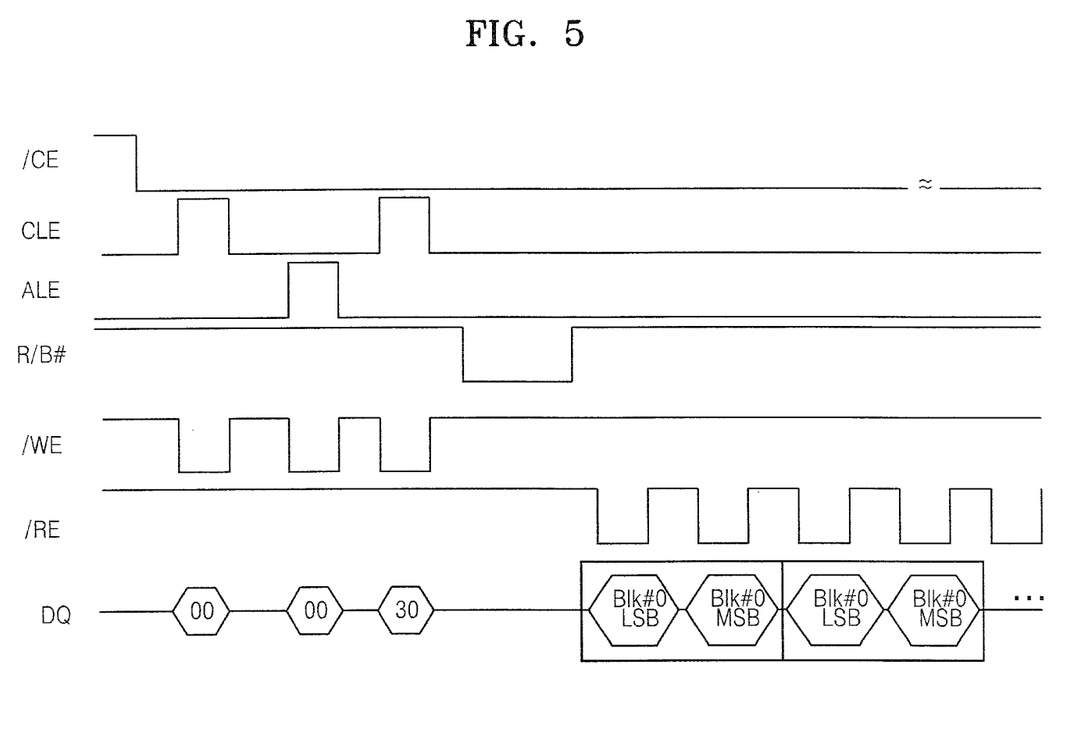
FIG. 5 is a timing diagram of a process of reading and storing an erase count during initialization of a memory system, according to an exemplary embodiment of the inventive concept.

FIG. 5 is a timing diagram of a process of reading and storing an erase count during initialization of a memory system, according to an exemplary embodiment of the inventive concept. In an exemplary embodiment of the inventive concept, in a hidden cell, each cell that stores erase counts of flash memory blocks is 16 bits long and the erase counts are divided and stored into 8 least significant bits (LSBs) and 8 most significant bits (MSBs).

If a control signal /CE is logic low and, for example, an erase count read command 0x30 is given in order to read the erase counts from the hidden cell, then LSBs and MSBs of all the flash memory blocks, e.g., an LSB and MSB of an erase count of a flash memory block #0, an LSB and MSB of an erase count of a flash memory block #1, . . . , and an LSB and MSB of an erase count of a flash memory block #n (n being a natural number equal to or greater than 2), are sequentially read from the hidden cell and stored in a temporary memory unit after a standby time.

It would, however, be apparent to those of ordinary skill in the art that an order or method of reading the LSBs and MSBs of the erase counts is not limited and may be determined in various ways.

Figure 6:
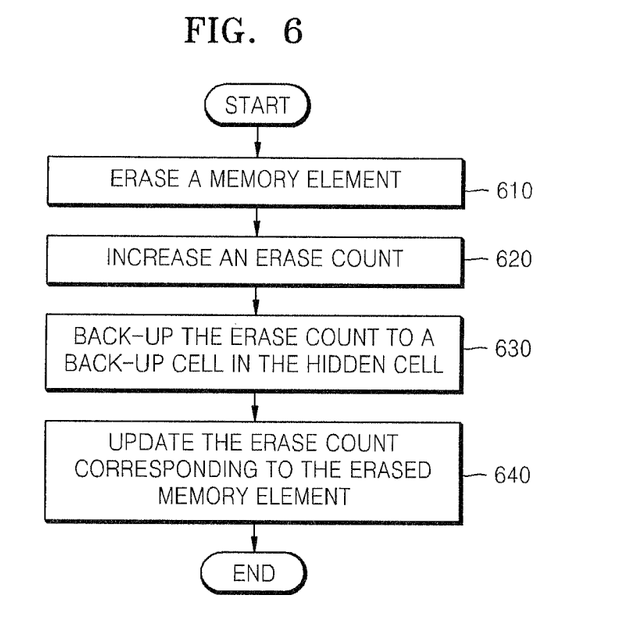
FIG. 6 is a flowchart illustrating a method of updating an erase count, according to an exemplary embodiment of the inventive concept.

FIG. 6 is a flowchart illustrating a method of updating an erase count, according to an exemplary embodiment of the inventive concept. First, a predetermined element of a memory device is erased (operation 610). If the memory device is NAND flash memory, the memory device is erased on a block basis before being programmed, and the predetermined element is a memory block in this case.

Next, a counter increases an erase count of the block which has been erased, by '1' (operation 620). In order to store the increased erase count, the original erase count of the block that has been erased increases by 1. Thus, the increased erase count is stored into an erase count storing region of the hidden cell, which corresponds to the block that has been erased. In this case, in the case of NAND flash memory, the ID of the block that has been erased, e.g., the ID of a block #0 or a block #1, is also needed. The corresponding erase count storing region of the hidden cell, which needs to be updated, may be detected using the ID of the block that has been erased. In addition to the erase count, the hidden cell may include location information of each block so that the memory system may perform a wear leveling using the location information.

Next, the original erase count of the block that has been erased is backed up before the original erase count is updated in the corresponding erase count storing region (operation 630). Accordingly, in the event when a certain error occurs such as a power failure during updating of the erase count in the erase count storing region of the hidden cell when the memory device is erased, an erase count having a minimum error rate may be used since the original erase count has been backed up.

In general, it takes relatively long to erase a block of NAND flash memory, and thus, such an erase count backup and updating may be completed while the NAND flash memory is erased. Therefore, additional time is not needed for updating an erase count.

After the original erase count is backed up, the erase count of the block that has been erased is updated in the corresponding erase count storing region of the hidden cell (operation 640). For example, in the case of NAND flash memory, when the block #0 is erased, an erase count storing region of the hidden cell corresponding to the erase count of the block #0 is updated.

Figure 7:
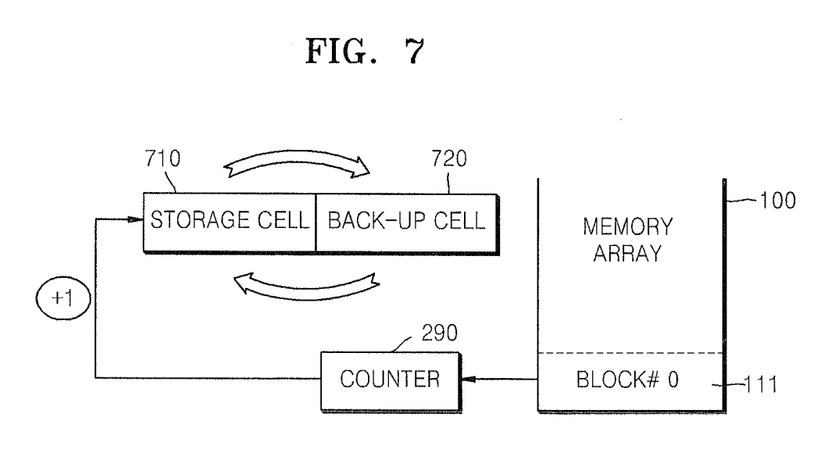
FIG. 7 is a diagram illustrating a process of backing up an erase count storing cell of a hidden cell, according to an exemplary embodiment of the inventive concept.

FIG. 7 is a diagram illustrating a process of backing up an erase count storing cell of a hidden cell, according to an exemplary embodiment of the inventive concept. In the current exemplary embodiment, a block #0 111 is erased in NAND flash memory. If the block #0 111 that is an erase element of a memory array 100 is erased, a counter 290 increases an erase count of the block #0 111 by '1' and an erase count storing region 710 corresponding to the block #0 111 is prepared to be updated in the hidden cell.

In this case, in the hidden cell, the original erase count of the block #0 111 is backed up in a backup region 720 corresponding to the erase count storing region 710 before the original erase count is updated. After the backup is completed, an erase count of the erase count storing region 710 is increased by '1', thereby completing the updating of the erase count storing region 710.

Accordingly, even if an accident occurs during erasing of a memory block, an erase count having a minimum error rate is secured.

Figure 8:
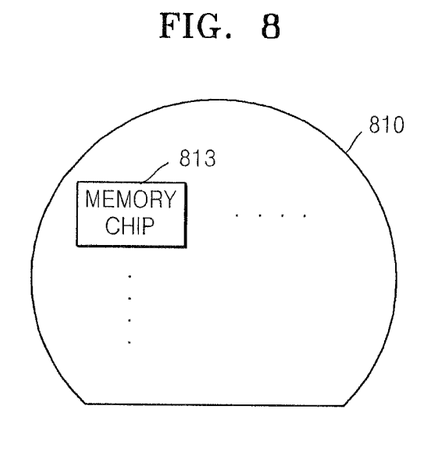
FIG. 8 illustrates a wafer and a memory chip mounted on the wafer according to an exemplary embodiment of the inventive concept.

FIG. 8 illustrates a wafer 810 and a memory chip 813 mounted on the wafer 810, according to an exemplary embodiment of the inventive concept. The memory chip 813 may be constructed according to one of the above-described exemplary embodiments.

Figure 9:
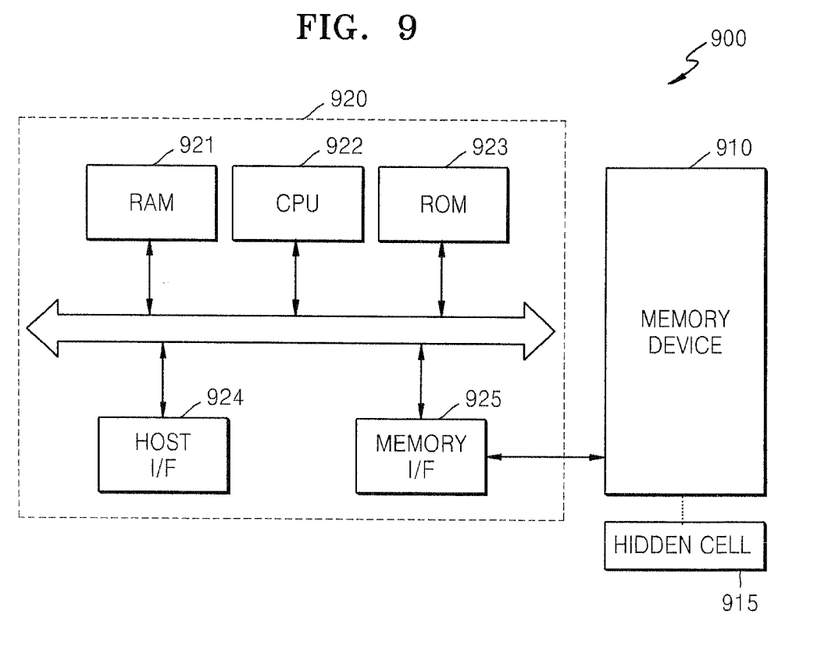
FIG. 9 is a block diagram of a memory card according to an exemplary embodiment of the inventive concept.

FIG. 9 is a block diagram of a memory card 900 according to an exemplary embodiment of the inventive concept. In the memory card 900, a flash memory device 910 with a hidden cell 915 according to an exemplary embodiment of the inventive concept may be installed. In an exemplary embodiment of the inventive concept, the memory card 900 may include a memory controller 920 for controlling data exchange between a host (not shown) and the flash memory device 910.

A RAM 921 is used as an operating memory of a central processing unit 922. In the current exemplary embodiment, the memory card 900 may further include a read only memory (ROM) 923 that stores code data for interfacing with the host. A host interface 924 includes a data exchange protocol of the host connected to the memory card 900. The memory interface 925 interfaces with the flash memory device 910. The central processing unit 922 performs a control operation of the memory controller 920 for exchanging data with the memory device 910. In an exemplary embodiment the central processing unit 922 may implement wear leveling of memory device 910 utilizing wear leveling algorithm software code stored in ROM 923.

A flash memory device and a memory card according to an exemplary embodiment of the inventive concept may be used in a memory system, such as a solid stated disk (SSD).

Figure 10:
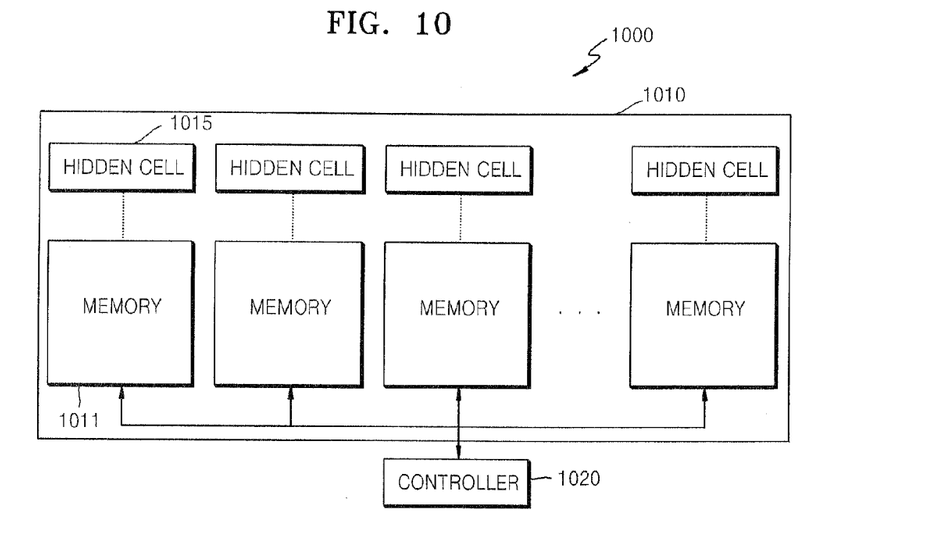
FIG. 10 is a block diagram of a memory module system having a memory controller and a memory module according to an exemplary embodiment of the inventive concept.

FIG. 10 is a block diagram of a memory module system 1000 having a memory controller 1020 and a memory module 1010 according to an exemplary embodiment of the inventive concept. Referring to FIG. 10, in the memory module system 1000, a memory device 1011 mounted on the memory module 1010 and a hidden cell 1015 may be implemented according to one of the above-described exemplary embodiments.

Figure 11:
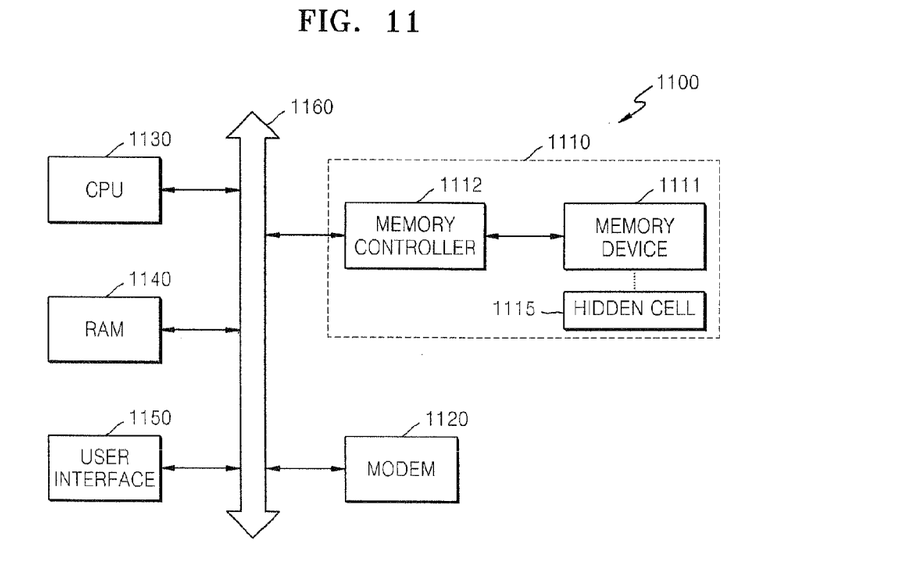
FIG. 11 is a schematic block diagram of an information processing system according to an exemplary embodiment of the inventive concept.

FIG. 11 is a schematic block diagram of an information processing system 1100 according to an exemplary embodiment of the inventive concept. In FIG. 11, a memory device 1111 may be implemented according to one of the above-described exemplary embodiments.

Referring to FIG. 11, the information processing system 1100 may include a non-volatile memory device 1110 according to an exemplary embodiment of the inventive concept. The memory device 1111 and a hidden cell 1115 may be parts of the non-volatile memory system 1110. In the current exemplary embodiment, the information processing system 1100 further includes a modem 1120, a central processing unit (CPU) 1130, a RAM 1140, and a user interface 1150 that are electrically connected to the non-volatile memory system 1110 via a system bus 1160.

The non-volatile memory system 1110 stores data processed by the CPU 1130 or data received from the outside. The non-volatile memory system 1110 may be embodied as an SSD, and in this case, the information processing system 1100 may stably store a large amount of data in the non-volatile memory system 1110. Although not shown, the information processing system 1100 according to the current exemplary embodiment may further include an application chipset, a camera image processor (CIS), a mobile DRAM, or an I/O device.

With mobile devices, such as cellular phones, PDAs, digital cameras, portable game consoles, navigation systems, and MP3 players, having come into widespread use, a flash memory device may be used widely as not only a data storage device but also a code storage device. The flash memory device may also be used in the field of home applications, such as high-definition televisions (HDTVs), digital versatile discs (DVDs), routers, and global positioning systems (GPSs).

A flash memory device according to an exemplary embodiment of the inventive concept may be mounted in various types of packages. For example, the flash memory device may be mounted in Package on Packages (PoPs), Ball grid arrays (BGAs), Chip scale packages (CSPs), Plastic Leaded Chip Carriers (PLCCs), Plastic Dual In-Line Packages (PDIPs), Die in Waffle Packs, Die in Wafer Forms, Chip On Boards (COBs), Ceramic Dual In-Line Packages (CERDIPs), Plastic Metric Quad Flat Packs (MQFPs), Thin Quad Flatpacks (TQFPs), Small Outlines (SOICs), Shrink Small Outline Packages (SSOPs), Thin Small Outlines (TSOPs), Thin Quad Flatpacks (TQFPs), System In Packages (SIPS), Multi Chip Packages (MCPs), Wafer-level Fabricated Packages (WFPs), or Wafer-Level Processed Stack Packages (WSPs).

The inventive concept can be embodied as computer readable code in a computer readable medium. Here, the computer readable medium may be any recording apparatus capable of storing data that is read by a computer system, e.g., a read-only memory (ROM), a random access memory (RAM), a compact disc (CD)-ROM, a magnetic tape, a floppy disk, an optical data storage device, and so on.

The computer readable medium can be distributed among computer systems that are interconnected through a network, and the inventive concept may be implemented and stored as computer readable code in the distributed system. A functional program, code, and code segments for accomplishing the inventive concept may be easily derived by programmers in the technical field to which the inventive concept pertains.

While the inventive concept has been particularly shown and described with reference to exemplary embodiments thereof, it will be understood that various changes in form and details may be made therein without departing from the spirit and scope of the following claims.

What is claimed is:

1. A method of managing an erase count of a non-volatile memory device comprising data storage cells to include hidden cells located separate from the data storage cells and not accessible to users of the data storage cells, the method comprising:
   when at least one data storage cell of the non-volatile memory device is erased, increasing an erase count stored in an erase count storing region of a hidden cell corresponding to the at least one erased data storage cell, and
   before increasing the erase count stored in the erase count storing region of the hidden cell, backing up the erase count stored in the erase count storing region of the hidden cell in a backup region of the hidden cell corresponding to the erase count storing region.

2. The method of claim 1, further comprising, during initialization of the non-volatile memory device:
   receiving an erase count read command for reading the erase count of the non-volatile memory device;
   reading the erase count from the erase count storing region of the hidden cell; and storing the
   read erase count in a temporary memory unit.

3. The method of claim 2, wherein:
   the erase count storing region is divided into a least significant bit region and a most significant bit region, and
   when the erase count is read from the erase count storing region, the erase count is read from both the least significant bit region and the most significant bit region and is then stored in the temporary memory unit.

4. The method of claim 1, wherein a counter increases the erase count stored in the erase count storing region of the hidden cell corresponding to the at least one data storage cell, when the at least one data storage cell is sensed.

5. The method of claim 1, wherein the erase count storing region of the hidden cell further stores location information of the at least one data storage cell.

6. The method of claim 1, wherein:
   the non-volatile memory device is NAND flash memory,
   a plurality of data storage cells are included in a block of the NAND flash memory, and
   the erase count corresponds to a block erasure.

7. A method of managing an erase count of a non-volatile memory device including a hidden cell located separate from data storage cells of the non-volatile memory device and not accessible to users of the data storage cells, the method comprising:
   powering the non-volatile memory device on;
   receiving an erase count read command for reading an erase count stored in the hidden cell; and
   reading the erase count from the hidden cell and storing the erase count in a temporary memory unit.

8. The method of claim 7, wherein the receiving of the erase count read command is performed together with initialization of a flash translation layer.

9. The method of claim 7, wherein the erase count stored in the hidden cell corresponding to at least one data storage cell of the non-volatile memory device is increased when the at least one data storage cell is erased.

10. The method of claim 7, wherein:
    the non-volatile memory device is NAND flash memory,
    a plurality of data storage cells are included in a block of the NAND flash memory, and
    the erase count corresponds to a block erasure.

11. The method of claim 7, further comprising performing wear leveling by reading the erase count from the temporary memory unit.

12. The method of claim 7, the temporary memory unit is a random access memory.

13. A non-volatile memory device comprising:
a counter for increasing an erase count of at least one data storage cell of the non-volatile memory device when the at least one data storage cell is erased; and
a hidden cell for storing an increased erase count, and
a backup region for storing the erase count before the erase count is increased by the counter,
wherein the hidden cell is located separate from the at least one data storage cell and is not accessible to users of the at least one data storage cell.

14. The non-volatile memory device of claim 13, further comprising a temporary memory unit for reading the erase count from the hidden cell during initialization of the non-volatile memory device and storing a read erase count in the temporary memory unit.

15. The non-volatile memory device of claim 13, wherein:
the non-volatile memory device is NAND flash memory,
a plurality of data storage cells are included in a block of the NAND flash memory, and
the erase count corresponds to a block erasure.

16. A non-transitory computer readable medium comprising:
a first computer program instruction for inputting an erase count read command for reading an erase count of a non-volatile memory device and storing a read erase count in a hidden cell of the non-volatile memory device during initialization of the non-volatile memory device; and
a second computer program instruction for storing in a temporary memory unit an erase count read from the hidden cell,
wherein the hidden cell is located separate from data storage cells of the non-volatile memory device and is not accessible to users of the data storage cells.

17. The non-transitory computer readable medium of claim 16, further comprising a third computer program instruction for increasing an erase count corresponding to at least one data storage cell of the non-volatile memory device when the at least one data storage cell is erased.

18. The non-transitory computer readable medium of claim 17, further comprising a fourth computer program instruction for backing up the corresponding erase count in a backup region of the hidden cell before increasing the corresponding erase count when the at least one data storage cell is erased.

19. A method for increasing the lifetime of a flash memory, the method comprising:
configuring the flash memory comprising data storage cells to include a hidden cell located separate from the data storage cells and not accessible to users of the data storage cells;
storing in an erase count storing region of the hidden cell an erase count corresponding to at least one erased data storage cell and increasing the erase count when the at least one data storage cell is erased; and
performing during a write or erase operation wear leveling using current erase counts such that mapping swapping of the data storage cells is performed according to a wear leveling algorithm,
wherein data storage cells having a current erase count greater than a predetermined erase count amount are prevented from being used.

* * * * *